United States Patent
Gallardo et al.

(10) Patent No.: US 9,645,082 B1
(45) Date of Patent: May 9, 2017

(54) BALLISTIC CARRIER SPECTRAL SENSOR

(71) Applicant: Sharp Kabushiki Kaisha, Osaka (JP)

(72) Inventors: Diego Gallardo, Byfield (GB); James Andrew Robert Dimmock, Oxford (GB); Matthias Kauer, Oxford (GB); Valerie Berryman-Bousquet, Chipping Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/160,417

(22) Filed: May 20, 2016

(51) Int. Cl.
| | |
|---|---|
| H01L 31/072 | (2012.01) |
| G01N 21/552 | (2014.01) |
| G01J 3/28 | (2006.01) |
| H01L 31/054 | (2014.01) |
| H01L 31/0352 | (2006.01) |
| H01L 31/055 | (2014.01) |

(52) U.S. Cl.
CPC .......... G01N 21/554 (2013.01); G01J 3/2803 (2013.01); G01J 2003/2806 (2013.01); H01L 31/035236 (2013.01); H01L 31/055 (2013.01); H01L 31/0543 (2014.12)

(58) Field of Classification Search
CPC ............ B82Y 20/00; H01L 31/035236; H01L 31/055; H01L 31/0543; H01L 31/0304; H01L 31/03046; Y02E 10/544; G01N 21/554; G01J 3/2803
See application file for complete search history.

(56) References Cited

U.S. PATENT DOCUMENTS

| | | | | |
|---|---|---|---|---|
| 4,286,275 A | | 8/1981 | Heiblum | |
| 4,833,517 A | | 5/1989 | Heiblum et al. | |
| 5,036,371 A | * | 7/1991 | Schwartz | H01L 29/225 257/14 |
| 5,969,375 A | * | 10/1999 | Rosencher | H01L 31/0236 257/13 |
| 8,921,687 B1 | * | 12/2014 | Welser | H01L 31/00 136/255 |

(Continued)

FOREIGN PATENT DOCUMENTS

WO   WO 2015/069367   5/2015

*Primary Examiner* — Sang Nguyen
(74) *Attorney, Agent, or Firm* — Renner, Otto, Boisselle & Sklar, LLP

(57) ABSTRACT

A ballistic carrier spectral sensor includes a photon absorption region to generate photo-generated carriers from incident light; a first potential barrier region adjacent the photon absorption region and having an adjustable height defining a minimum energy of the photo-generated carriers required to pass therethrough; a second potential barrier region having an adjustable height defining a minimum energy of the photo-generated carriers required to pass therethrough; a spillage well region disposed between the first potential barrier region and the second potential barrier region and configured to collect photo-generated carriers having an energy lower than that required to pass through the second potential barrier region; and a collection region adjacent the second potential barrier region and configured to collect carriers that cross the second potential barrier region. A total thickness of the first potential barrier region and the spillage well region is less than a mean free path of the photo-generated carriers.

20 Claims, 10 Drawing Sheets

(56) References Cited

U.S. PATENT DOCUMENTS

| | | | |
|---|---|---|---|
| 2007/0296835 A1* | 12/2007 | Olsen | H01L 27/14652 348/234 |
| 2010/0102298 A1* | 4/2010 | Wu | H01L 27/0605 257/25 |
| 2011/0220191 A1* | 9/2011 | Flood | B82Y 10/00 136/255 |
| 2012/0248413 A1* | 10/2012 | Dimmock | B82Y 20/00 257/25 |
| 2015/0268394 A1* | 9/2015 | Uchiyama | G02B 1/115 359/653 |

* cited by examiner

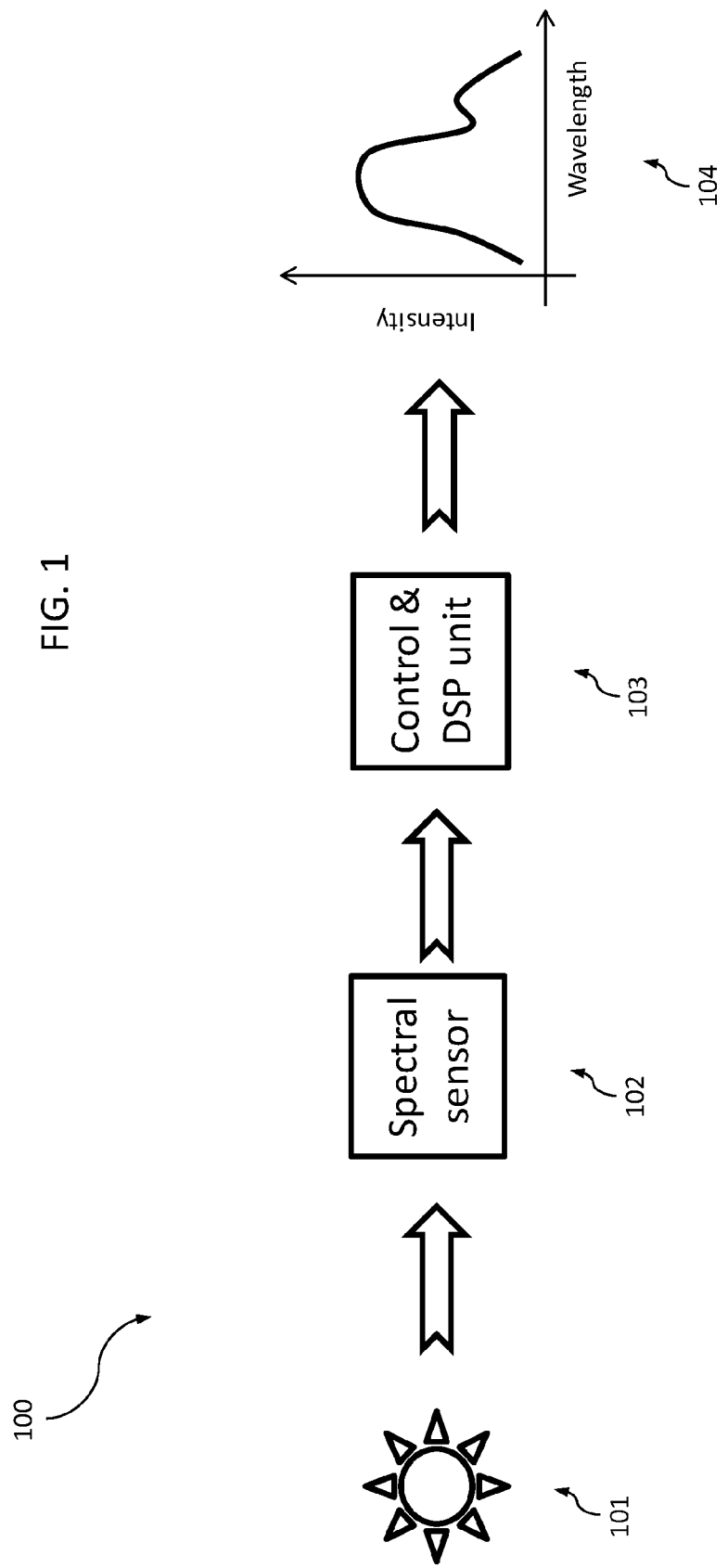

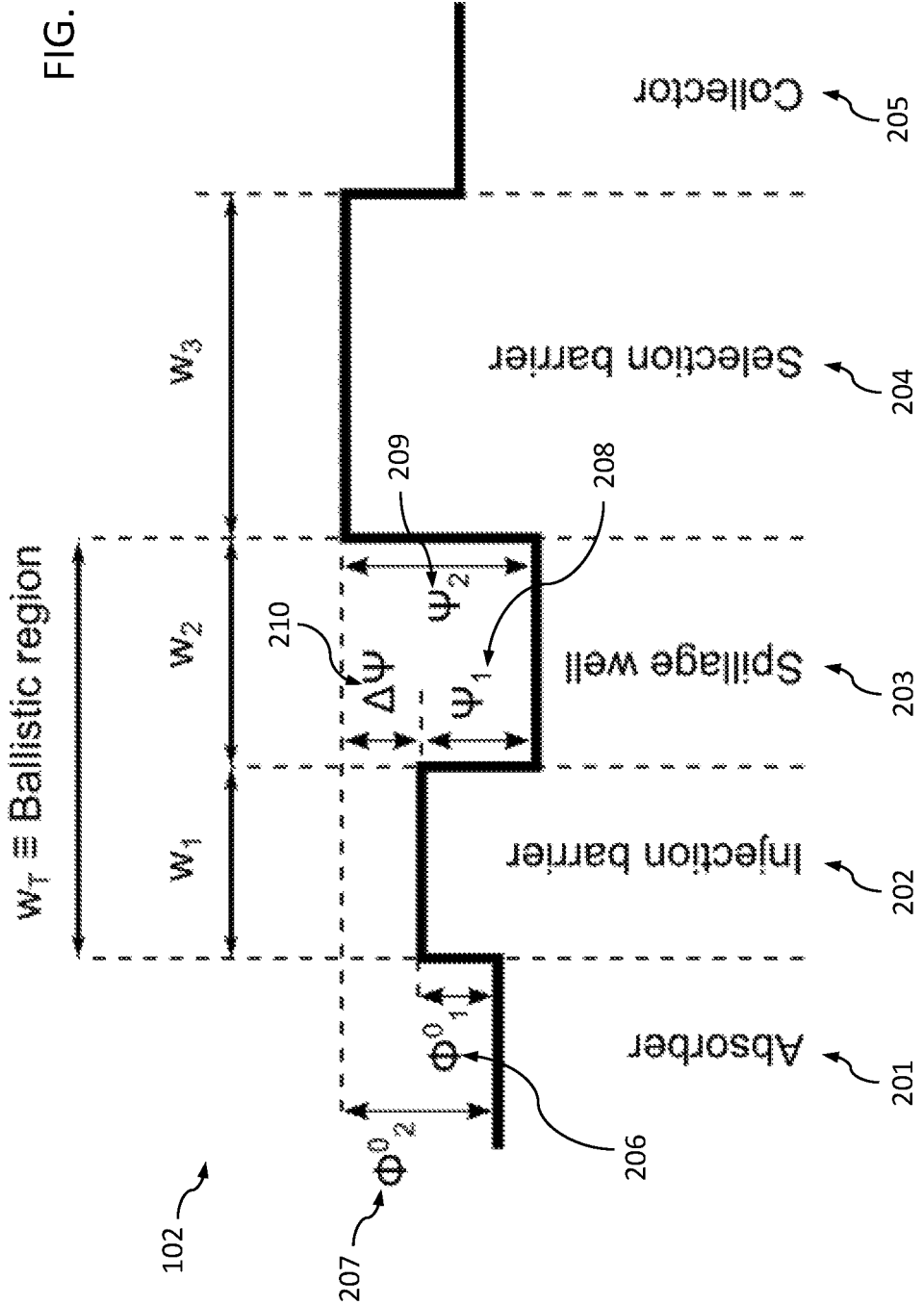

FIG. 5(C)
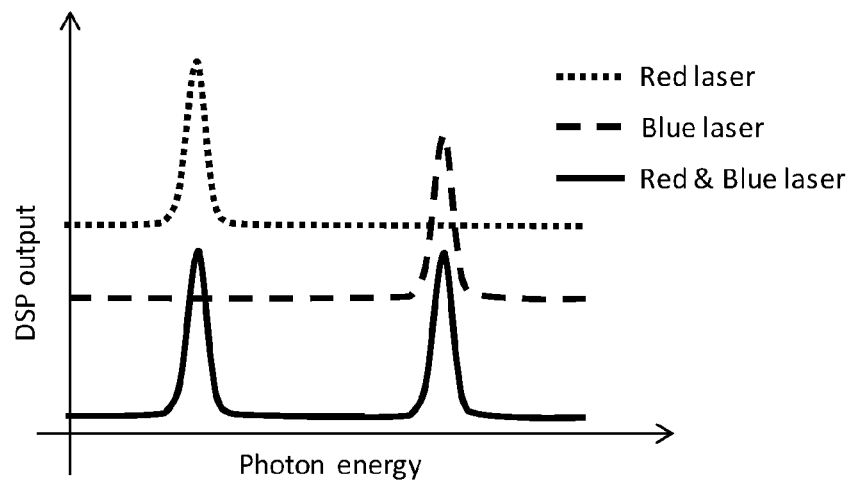
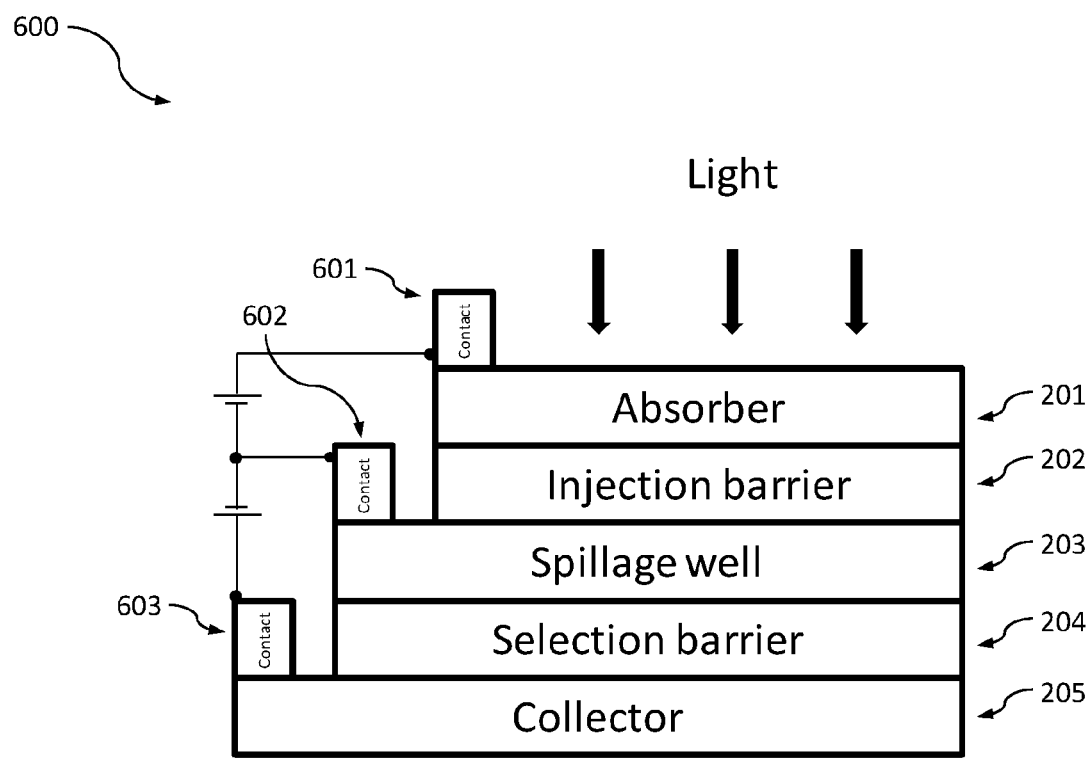
FIG. 6

BALLISTIC CARRIER SPECTRAL SENSOR

TECHNICAL FIELD

The present invention relates to spectral sensors. In particular, the present invention relates to optical sensors capable of providing spectral information about light incident thereon. Such a spectral sensor may be used in substance identification and quantification, and may find applications in, for example, mobile phones, printers, medical equipment, automotive and scientific instruments.

BACKGROUND ART

Optical spectroscopy is a very powerful analytical technique. It allows the identification of substances and materials, their quantification, and the measurements of physical parameters.

Most optical spectroscopy equipment has a dispersive element such as a prism, a diffraction grating or a variable filter as the core light-analyzing element, coupled to suitable optics (e.g., slits, mirrors, and/or lenses). These dispersive elements take broadband light as an input and separate its different wavelengths spatially. Dispersive spectroscopy equipment, such as those based on diffraction gratings, can achieve very high resolutions. However, spatial wavelength separation traditionally requires the rotation of some elements in the optical path in order to analyze the subject light. More recently, optical sensors such as complementary metal-oxide semiconductor (CMOS) pixel arrays have been used to capture a wide segment of the spatial output, and the desired wavelength is selected electronically. The main disadvantages of these techniques are the relatively large size of the rigs, the need for precise optical alignment, the presence of multiple optical surfaces susceptible to fouling, and other factors such as price. Miniaturization of some elements has allowed the reduction of size of some spectrometric solutions down to the centimeter scale, but usually this scale reduction implies a trade-off in resolution and sensitivity.

Other optical spectrometers use color filters to break up the subject light into a number of discrete "bins" of light, each bin comprising a certain region of the optical spectrum. The resolution of these systems depends on the bandwidth of the bins, and the number of different spectral bins. In general, the resolution of filter-based spectrometers is lower than those using dispersive elements. Therefore, filter-based solutions have typically been implemented where the resolution requirements are not too stringent.

Other techniques based on recent developments have appeared in the literature, such as surface plasmon resonance and graphene absorbers. However, these techniques are in the development phase and no commercial applications have been found yet.

There is a need for a compact device that can provide spectral information from a subject light without the shortcomings of present solutions. In particular, it is desirable to provide a device with electronic tuneability, so that there is no need for dispersive element(s) or mechanical adjustments. It is also desirable to provide the device in a small size, permitting the integration in portable equipment and products such as handheld medical devices, tablets and mobile phones.

Ballistic electrons have been utilized in prior art devices. For example, U.S. Pat. No. 4,286,275 (Heiblum, published Aug. 25, 1981) and U.S. Pat. No. 4,833,517 (Heiblum et al., published May 23, 1989) describe embodiments of ballistic electron transistors. However, such devices have specific structures and parameters for use as transistors, and have not been adapted to perform as an optical spectrometer.

In some implementations, in contrast to the above mentioned transistors employing ballistic carrier transport, WO 2015/069367A2 (Perera et al., published May 14, 2015) presents a tuneable hot-carrier photodetector that exploits hot-hole dynamics, but does not use ballistic transport, instead relying on other structural features and a double absorption step to analyze the subject light.

CITATION LIST

U.S. Pat. No. 4,286,275 (Heiblum, Aug. 25, 1981)
U.S. Pat. No. 4,833,517 (Heiblum et al., May 23, 1989)
WO 2015/069367A2 (Perera et al., May 14, 2015)

SUMMARY OF THE INVENTION

The present invention describes the structure of a multi-terminal electronic device that, by using ballistic carriers, functions as a spectrometer, or spectral sensor.

In accordance with one aspect of the present disclosure, a ballistic carrier spectral sensor includes: a photon absorption region configured to generate photo-generated carriers from incident light; a first potential barrier region adjacent the photon absorption region in a thickness direction and having an adjustable height, the height of the first potential barrier region defining a minimum energy of the photo-generated carriers required to pass therethrough; a second potential barrier region having an adjustable height, the height of the second barrier adjustable independent of the height of the first potential barrier region and defining a minimum energy of the photo-generated carriers required to pass therethrough; a spillage well region disposed between the first potential barrier region and the second potential barrier region in the thickness direction, the spillage well region configured to collect photo-generated carriers having an energy lower than that required to pass through the second potential barrier region; and a collection region adjacent the second potential barrier region and configured to collect carriers that cross the second potential barrier region, wherein a total thickness of the first potential barrier region and the spillage well region is less than a mean free path of the photo-generated carriers.

In some embodiments, the height of the first potential barrier region is less than the height of the second potential barrier region.

In some embodiments, the thickness of the first potential barrier region reduces tunneling transfer of photo-generated carriers with an energy below its height to less than 5% of the total electron transfer.

In some embodiments, the thickness of the first potential barrier is 15 nm to 30 nm.

In some embodiments, the thickness of the second potential barrier region reduces tunneling transfer of carriers with an energy below its height to less than 5% of the total electron transfer.

In some embodiments, the thickness of the second potential barrier region is 20 nm to 110 nm.

In some embodiments, the first potential barrier region, the second potential barrier region, the spillage well region, and the collection region include respective semiconductor materials.

In some embodiments, the first potential barrier region, the second potential barrier region, the spillage well region, and the collection region form a semiconductor heterostructure.

In some embodiments, the photon absorption region includes a metal. The photon absorption region may include Silver.

In some embodiments, the photon absorption region includes a semiconductor material.

In some embodiments, the photon absorption region includes n-type $In_xGa_{1-x}As$, where the x indicates the fraction of the composition ($0 \leq x \leq 1$); the regions other than the photon absorption region are respectively comprised of $Al_xGa_{1-x}As$, wherein: the first potential barrier region and the second potential barrier region include intrinsic type semiconductor materials; and the spillage well region and the collector region include n+ type semiconductor materials.

In some embodiments, the photon absorption region has a lower band gap energy than the band gap energy of the spillage well region.

In some embodiments, a thickness of the photon absorption region is less than a mean free path of the photo-generated carriers. The photon absorption region may be less than 100 nm thick.

In some embodiments, the ballistic carrier spectral sensor further includes one or more additional optical coatings superimposed on the photon absorption region in the thickness direction, the one or more additional optical coatings configured to reduce reflection of light.

In some embodiments, the ballistic carrier spectral sensor further includes one or more additional optical coatings superimposed on the photon absorption region in the thickness direction, the one or more additional optical coatings configured to excite plasmon resonances.

In some embodiments, the ballistic carrier spectral sensor further includes one or more passivation regions included at one or both sides of the sensor in the thickness direction.

In some embodiments, the ballistic carrier spectral sensor further includes one or more additional optical filtering regions superimposed on the photon absorption region in the thickness direction to limit the lower and/or upper limit of wavelengths of the light entering the device.

In accordance with another aspect of the present disclosure, an imaging device includes an array of the ballistic carrier spectral sensors, each ballistic carrier spectral sensor including: a photon absorption region configured to generate photo-generated carriers from incident light; a first potential barrier region adjacent the photon absorption region in a thickness direction and having an adjustable height, the height of the first potential barrier region defining a minimum energy of the photo-generated carriers required to pass therethrough; a second potential barrier region having an adjustable height, the height of the second barrier adjustable independent of the height of the first potential barrier region and defining a minimum energy of the photo-generated carriers required to pass therethrough; a spillage well region disposed between the first potential barrier region and the second potential barrier region in the thickness direction, the spillage well region configured to collect photo-generated carriers having an energy lower than that required to pass through the second potential barrier region; and a collection region adjacent the second potential barrier region and configured to collect carriers that cross the second potential barrier region, wherein a total thickness of the first potential barrier region and the spillage well region is less than a mean free path of the photo-generated carriers.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 1 shows a schematic representation of the basic arrangement for using the spectral sensor of the present application.

FIG. 2 shows a schematic structure of the conduction band of the spectral sensor of the present application.

FIGS. 5A-5C are graphs showing exemplary outputs of the spectral sensor of the present application before and after digital signal processing (DSP).

FIG. 6 is a schematic view of an exemplary architecture of the spectral sensor of the present application based on stacked regions.

DEFINITION OF TERMS

Figure 3A:
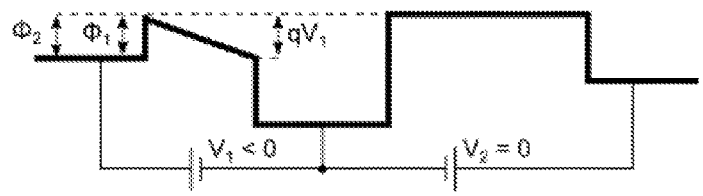
FIGS. 3A-3F schematically show examples of modes of operation of the spectral sensor of the present application according to different applied biases.
Figure 3B:
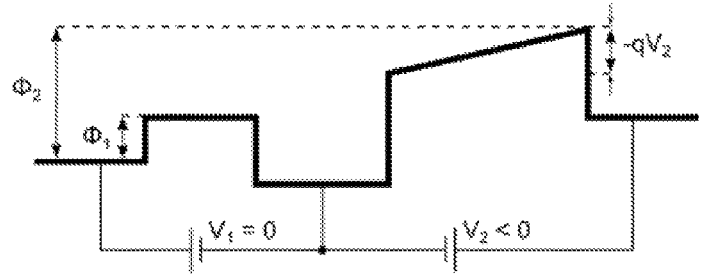
Figure 3C:
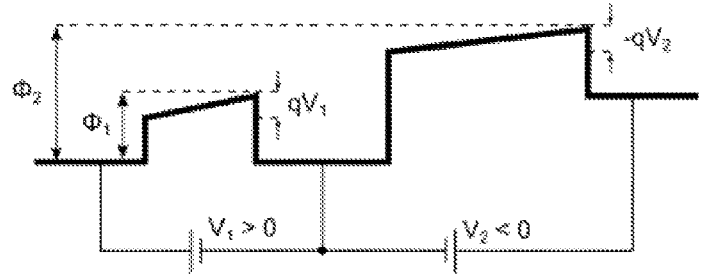
Figure 3D:
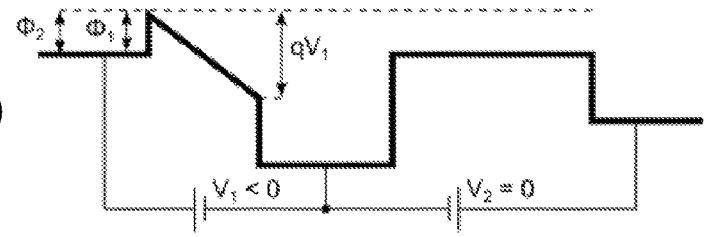
Figure 3E:
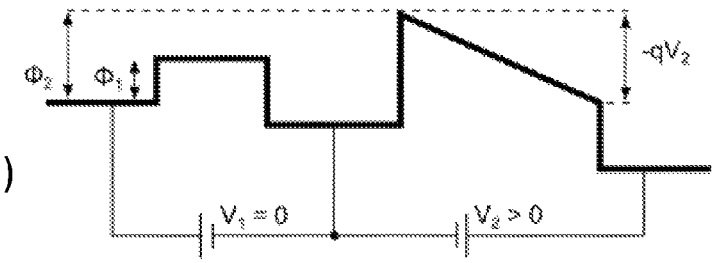
Figure 3F:
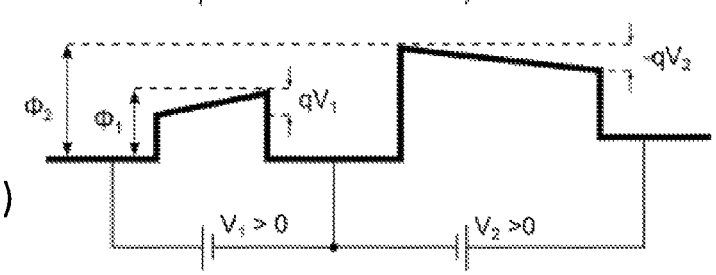

Subject light: Light that is subject to analysis, and whose spectral characteristics are to be determined.

Ballistic carrier: A charge carrier (electron or hole) that has not suffered a scattering event, with the associated change in energy and/or momentum. A photo-generated ballistic carrier preserves information about the photon that generated it, in the form of excess kinetic energy.

Hot carrier: A carrier whose kinetic energy is larger than the average equilibrium kinetic energy of the same type of carrier in a given material. Due to the relation between kinetic energy and temperature, a hot carrier is defined as a carrier in a population with a temperature higher than the lattice temperature. A carrier can suffer a number of scattering events and still be a hot carrier, but would not be ballistic.

Photo-generated carrier: A photo-generated electron (photoelectron) or a photo-generated hole. In the description set forth below, the photo-generated carrier is typically discussed in the context of a photoelectron. But in some embodiments, the photon detection device of the present application may be implemented in such a way that the valence band and photo-generated holes take the role that the conduction band and photo-generated electrons play. In some embodiments, there may be a benefit to using a conduction band structure, since the electron mass is often lighter than the hole mass, resulting in more energy being given to the photo-generated electron than the photo-generated hole.

Mean free path: The average length traveled by a carrier between scattering events. It is possible to assign different mean free paths to different scattering mechanisms.

Thermalization: The process by which a carrier loses its excess energy. This process is generally the combined effect of several scattering mechanisms.

Injection barrier (first potential barrier): A region, following the absorber, that provides a potential barrier which determines the minimum energy that electrons must have to be emitted from the absorber to the rest of the structure.

Spillage well: A region, following the injection barrier, that collects the electrons that cannot cross the selection barrier.

Selection barrier (second potential barrier): A region following the spillage well that provides a potential barrier which determines the minimum energy that electrons must have to cross into the collector.

Height: Potential energy difference between two points in an energy diagram. When applied to a barrier, it is the potential energy difference between the lowest and highest points in a barrier.

$w_1$: The thickness of the injection barrier.
$w_2$: The thickness of the spillage well.
$w_3$: The thickness of the selection barrier.
$w_T$: The total thickness of the regions over which ballistic transport is required.

DETAILED DESCRIPTION OF INVENTION

The invention disclosed herewith presents an optical spectral sensor that uses ballistic carriers to analyze a subject light. The device of the present application may provide a device with electronic tuneability, so that dispersive element(s) or mechanical adjustments are not needed; and may also provide the device in a small size.

FIG. 1 shows the basic arrangement (100) for utilizing the spectral sensor of the present application. As shown, a light source (101) provides the subject light whose spectral energy distribution is to be analyzed. The subject light is shone upon the spectral sensor (102), which produces data in the form of electric currents. These electric currents are analyzed by a digital signal processing (DSP) unit (103). The DSP unit also may control the sensor parameters. The control and DSP unit may output data (104), for example, in the form of light intensity versus wavelength. This data may constitute the sought after spectral distribution of the subject light.

The spectral sensor of the present application makes use of the information about the energy of the photon from which the photo-generated carriers are created. The information is preserved by the photo-generated carriers in the form of kinetic energy. This information is lost, after a certain time, through a number of processes known collectively as carrier thermalization. By collecting and analyzing photo-generated carriers before they thermalize (i.e. by using ballistic photo-generated carriers), the spectral sensor (102) of the present application is able to extract the energy information of the subject light.

Embodiments of the spectral sensor of the present application include: An absorbing region where photo-generated carriers are generated; an injection barrier that prevents quantum mechanical tunneling and thermionic emission of carriers from the absorber into further regions of the device, and that is adjustable such that it may provide for injection of ballistic photo-generated carriers only; a spillage well, where low energy and thermalized carriers are collected and removed from the circuit; a selection barrier, with a potential that is adjustable so as to determine the energy of the carriers that overcome this barrier; and a collector region, where ballistic photo-generated carriers of sufficient energy to pass over the injection and selection barriers are collected, and from which the sensor's output current is extracted.

The material composition, structure, dimensions, geometry, electric properties, contacts, potentials and biases of the different regions of the spectral sensor of the present application and their interfaces are configured to allow the efficient collection of ballistic photo-generated carriers in the collector region. Such features are described in more detail below.

FIG. 2 schematically shows an exemplary conduction band of the spectral sensor 102 of the present application. The conduction band shown in FIG. 2 may be characterized as a "simplified" or "idealized" conduction band, as other band diagrams may show band bending close to the different junctions. A zero applied potential condition may also not result in a flat band. In the embodiment shown, the spectral sensor 102 includes five regions (layers), namely an absorber (photon absorption region) (201), an injection barrier (first potential barrier region) (202), a spillage well (spillage well region) (203), a selection barrier (second potential barrier region) (204) and a collector (collection region) (205). The spectral sensor (102) extends in the thickness direction from left to right. The flow of electrons, according to FIG. 2, is from left to right. The absorber (201) absorbs photons from a subject light, generating photo-generated carriers (e.g., photoelectrons). The injection barrier (202) determines the minimum energy that photo-generated carriers must have to cross from the absorber (201) to the rest of the structure. The selection barrier (204) determines the minimum energy that photo-generated carriers must have to cross from the left into the collector (205). The spillage well (203) collects the photo-generated carriers that cannot cross the selection barrier (204). The collector (205) collects the photo-generated carriers that cross the selection barrier (204). The amount of photo-generated carriers collected per unit time constitutes the output current of the spectral sensor (102).

In the absence of applied biases (i.e., flat band condition), the height of the injection barrier (202) with respect to the absorber (201) is given by the energy $\phi^0_1$ (206), which is determined by the contact potential between the absorber and the injection barrier materials. Also in the flat band condition, the height of the selection barrier with respect to the absorber is given by the energy $\phi^0_2$ (207), which is determined by the contact potentials between the absorber, injection barrier, spillage well, and selection barrier materials.

The contact potential between the spillage well and the injection barrier is designated as $\psi_1$ (208). The contact potential between the spillage well and the selection barrier is designated as $\psi_2$ (209). The potential energy $\Delta\psi$ (210) is the difference between $\psi_2$ and $\psi_1$, and is represented by Equation (1):

$$\Delta\Psi = \Psi_2 - \Psi_1 \qquad (1)$$

The thicknesses of the injection barrier (202), spillage well (203) and selection barrier (204) are designated $w_1$, $w_2$ and $w_3$ respectively. The sum of $w_1$ and $w_2$ is $w_T$, which is the total thickness of the ballistic region.

In some embodiments, the absorber (201) may be a semiconductor or a metal. The spillage well (203) and the collector (205) may be n-doped semiconductors, respectively. The injection barrier (202) and the selection barrier (204) may be low-doped or intrinsic semiconductors, or insulators. The material(s) of the absorber (201), injection barrier (202), spillage well (203), selection barrier (204), and collector (205) may be chosen from a wide variety of semiconductor materials. Exemplary semiconductor materials include InGaAs, GaAs, AlGaAs, InGaSb, GaSb, AlGaSb, GaInP, InGaN, GaN, AlGaN, SiGeSn, InAlAs, and InP. The regions may be made from different respective materials so as to form heterostructures, which include for example semiconductor alloys such as InGaAs/GaAs/AlGaAs, InGaSb/GaSb/AlGaSb, GaInP/GaAs, InGaN/GaN/AlGaN, Si/Ge/Sn and InGaAs/InAlAs/InP. In embodiments where the absorber is a metal, such metal may be, for example, Silver.

The respective regions may be doped used any suitable material in any suitable amount. The nature and quantity of dopant(s) may depend on the specific material utilized in the respective regions. One example of doping is described below in connection with the spectral sensor shown in FIG. 7. In some embodiments, part of the injection barrier (202) and/or the selection barrier (204) may be a graded semiconductor such that it has a graded doping profile. In other embodiments, alternative materials may be used to provide the required functionality for any of the device regions.

The thickness of the injection barrier and spillage well may be provided so as to not exceed the mean free path in the materials chosen. The thickness of these regions may depend on the specific material utilized. One example is described below in connection with the spectral sensor shown in FIG. 7, where the thickness of the injection barrier is 15 nm and the thickness of the spillage well is 25 nm. In other exemplary embodiments, the thickness of the injection barrier is 15 nm to 30 nm. The thickness of the injection barrier may reduce tunneling transfer of photo-generated carriers with an energy below its height to less than 5% of the total electron transfer. In other exemplary embodiments, the thickness of the spillage well is 20 nm to 135 nm.

The thickness of the selection barrier may also be provided at an appropriate thickness depending on the specific material utilized. One example is described below in connection with the spectral sensor shown in FIG. 7, where the thickness of the selection barrier is 30 nm. In other exemplary embodiments, the thickness of the selection barrier is 20 nm to 110 nm. The thickness of the selection barrier may reduce tunneling transfer of carriers with an energy below its height to less than 5% of the total electron transfer.

The thickness of the absorber may also be provided at an appropriate thickness depending on the specific material utilized. In some embodiments, a thickness of the absorber is less than a mean free path of the photo-generated carriers. In one example, the absorber is less than 100 nm thick.

In an exemplary application, the spectral distribution of a subject light is to be determined using the spectral sensor of the present application. Accordingly, the subject light may be shined onto the absorber region of the spectral sensor such that it is incident on the absorber region. A fraction of the photons from the source light are absorbed by the absorber, thereby generating photo-generated carriers. Immediately after photon absorption, a photo-generated carrier generated in the absorber has a kinetic energy that is directly proportional to the energy of the absorbed photon. In other words, right after the absorption, the photo-generated carrier has information about the energy of the photon from which it was generated. Under these conditions, the photo-generated carrier is said to be in the ballistic regime. Consequently, by measuring the kinetic energy of a ballistic photo-generated carrier, it is possible to determine the energy of the incident photon. This is the mechanism that the spectral sensor of the present application uses to measure the spectral distribution of the subject light.

The ballistic regime is generally short lived. Several mechanisms compete to remove excess energy from the photo-generated carrier and bring it to the bottom of the conduction band. The process as a whole is known as thermalization, and it destroys the information about the incident photon that the spectral sensor utilizes. Hence, it is desired that the spectral sensor collect and analyze the energy of the photo-generated carriers before they thermalize.

Exemplary thermalization processes are carrier-carrier scattering (also known as electron-electron scattering), phonon scattering, impurity scattering and reflection at the interfaces; these processes are not mutually exclusive, although they typically happen at different time scales and depend differently on the energy of the photo-generated carrier, carrier concentration, temperature and other parameters.

The electron-electron scattering mechanism is due to the Coulomb interaction of the photo-generated carrier with other electrons in the device. This is generally the fastest thermalization process, with a characteristic time of the order of 100 fs. The electron-electron scattering is an elastic process by which the photo-generated carrier shares energy with other electrons present in the medium until they reach thermal equilibrium. The effects of electron-electron scattering grow with carrier concentration and temperature.

Phonon scattering occurs when the photo-generated carrier interacts with the crystal field, thereby absorbing or releasing phonons. This scattering mechanism is inelastic, affecting both the energy and momentum of the photo-generated carrier, and its effects grow with temperature. The characteristic time is 1 ps.

The photo-generated carriers can also be scattered by impurity atoms. These impurities can be a contaminant, an intentionally added impurity (e.g., doping atoms), defects in the lattice (e.g., vacancies, interstitial atoms, etc.), surface states and others. The impurities distort the crystal field, causing inelastic scattering of the photo-generated carrier.

Quantum mechanical reflection may occur when the photo-generated carrier crosses the interface between two different materials. This is typically due to the difference in effective mass at either side of the interface.

When photons from the subject light source strike the absorber, photo-generated carriers may be generated, depending on the characteristics of the incident radiation and of the absorber. As an example, suppose that during an arbitrary interval of time $\Delta t$, a number $n_1$ of these generated photo-generated carriers travel in the direction of the collector. A portion of these $n_1$ photo-generated carriers will not have enough energy to overcome the injection barrier and will thermalize in the absorber, leaving only $n_2 < n_1$ photo-generated carriers to travel further. Of these $n_2$ photo-generated carriers, some will lose energy through thermalization during their travel through the injection barrier and the spillage well, reaching the selection barrier with insufficient energy to surmount it; some other photo-generated carriers will travel without scattering (i.e. ballistically), but will not have enough energy to overcome the selection barrier either if they were generated by low energy photons. These photo-generated carriers will eventually thermalize to the bottom of the conduction band and end up collected by the spillage well and taken out to an external circuit. A certain number of photo-generated carriers may recombine with a hole in the valence band. After accounting for all these losses, only a number $n_3 < n_2$ of photo-generated carriers may cross all the way to the collector. As pointed out before, these $n_3$ photo-generated carriers will give raise to the output current $-e \times n_3/\Delta t$ (where e is the unit of electric charge).

In order to minimize unwanted thermalization of photoelectrons, the width ($w_1$) of the injection barrier (202) and the width ($w_2$) spillage well (203) may be reduced as much as practically possible. In some embodiments, the total thickness $w_T$ of these regions is less than the photo-generated carrier mean free path.

The spectral sensor may include electrical contacts configured to apply an external bias to the respective regions of the sensor. In some embodiments, electrical contacts may be in direct contact with the absorber, spillage well and collector, respectively. The contacts may be standard ohmic contacts for use in connection with the material of the absorber, spillage well and/or collector. In some embodiments, the contacts are shallow contacts that do not diffuse due to the thin region(s) that they contact. If diffusive contacts were used in such a device, a short circuit may exist between e.g. the absorber and spillage well. In an embodiment of a GaAs based spectral sensor in which the ballistic carriers are electrons, such a shallow, non-diffusive, ohmic, n-type contact may be PdGeAu metallization applied to an n-doped GaAs region.

The height of the injection barrier (202) with respect to the absorber (201) can be adjusted by applying an external bias $V_1$ between the absorber (201) and the spillage well (203). The height of the selection barrier (204) with respect to the spillage well (203) can be adjusted by applying an external bias $V_2$ between the spillage well (203) and the collector (205).

By adjusting the height of the injection barrier (202), the minimum energy of the photo-generated carriers that can cross from the absorber (201) towards the collector (205) can be restricted. This minimum energy value will be referred to herein as the injection energy ($\phi_1$). The injection barrier (202) also works to reduce the amount of electrons that may be excited from the absorber (201) to the spillage well (203) by thermionic emission, quantum mechanical tunneling, or any other unwanted effect. These current contributions removed by the injection barrier (202) would constitute a source of noise if they were to reach the collector. Hence, by removing them, the noise and current consumption of the device may be reduced, and the signal to noise ratio (SNR) and sensitivity of the device may be improved.

By adjusting the height of the injection barrier (202) and the selection barrier (204), the minimum energy of the electrons that may reach the collector can be selected and hence be detected. This minimum energy value will be referred to herein as the selection energy ($\phi_2$). By sweeping the height of the injection barrier (202) and the selection barrier (204), the operator can effectively scan the energy of the photo-generated carriers that reach the collector, and consequently obtain the spectral distribution of the subject light.

This is illustrated in FIG. 3, where the band diagram is shown for several exemplary embodiments with different applied values of $V_1$ and $V_2$. It can be seen that in each case the barrier heights obey the following Equations (2)-(4):

$$\Phi_1 = \begin{cases} \Phi_1^0 & \text{if } V_1 \leq 0 \\ \Phi_1^0 + qV_1 & \text{if } V_1 > 0 \end{cases} \quad (2)$$

$$\Phi_{int} = \Delta\Psi + \begin{cases} 0 & \text{if } V_2 \geq 0 \\ -qV_2 & \text{if } V_2 < 0 \end{cases} \quad (3)$$

$$\Phi_2 = \Phi_1^0 + \begin{cases} 0 & \text{if } \Phi_{int} \leq 0 \\ \Phi_{int} & \text{if } \Phi_{int} > 0 \end{cases} \quad (4)$$

where $\phi_{int}$ defines an internal energy difference. $\phi_{int}$ is a measure of the contribution of $V_2$ to $\phi_2$. As such, $\phi_{int}$ equals the energy difference between the spillage well side and the collector side of the selection barrier, when $V_2$ is negative. If $V_2$ is positive, then $\phi_{int}$ is zero, as in this case $V_2$ does not directly contribute to $\phi_2$.

The selection energy $\phi_2$ determines the minimum energy that a photo-generated carrier (e.g., ballistic or hot) must have to cross the device from the absorber (201) to the collector (205). Any photo-generated carrier that reaches the collector region with energy higher than the selection energy will contribute to the output current. This includes photo-generated carriers that have suffered some degree of thermalization (and hence are not ballistic) but that reach the collector with enough energy to go over the selection barrier. Hence, the collector current is proportional to the flux of electrons, ballistic or not, that reach the collector with energy equal or above the selection energy. In this sense, the output current is an integrated signal. The selection energy $\phi_2$ marks the minimum detectable energy. This minimum detectable energy sets a threshold for the detection of ballistic photo-generated carriers, and consequently a threshold energy for photon detection. By changing the selection energy $\phi_2$, the threshold photon energy that can be detected is changed, thereby allowing the spectral analysis of the light source.

It has been explained that the collector current is an integrated signal. The lower limit of the integration interval is the selection energy $\phi_2$. The upper limit is finite, and in general it is determined by the absorption characteristics of the absorber. Alternatively, in some embodiments, the upper limit may be set by an additional cut-off filter or other suitable mechanism (not shown in the figures).

Figure 4:
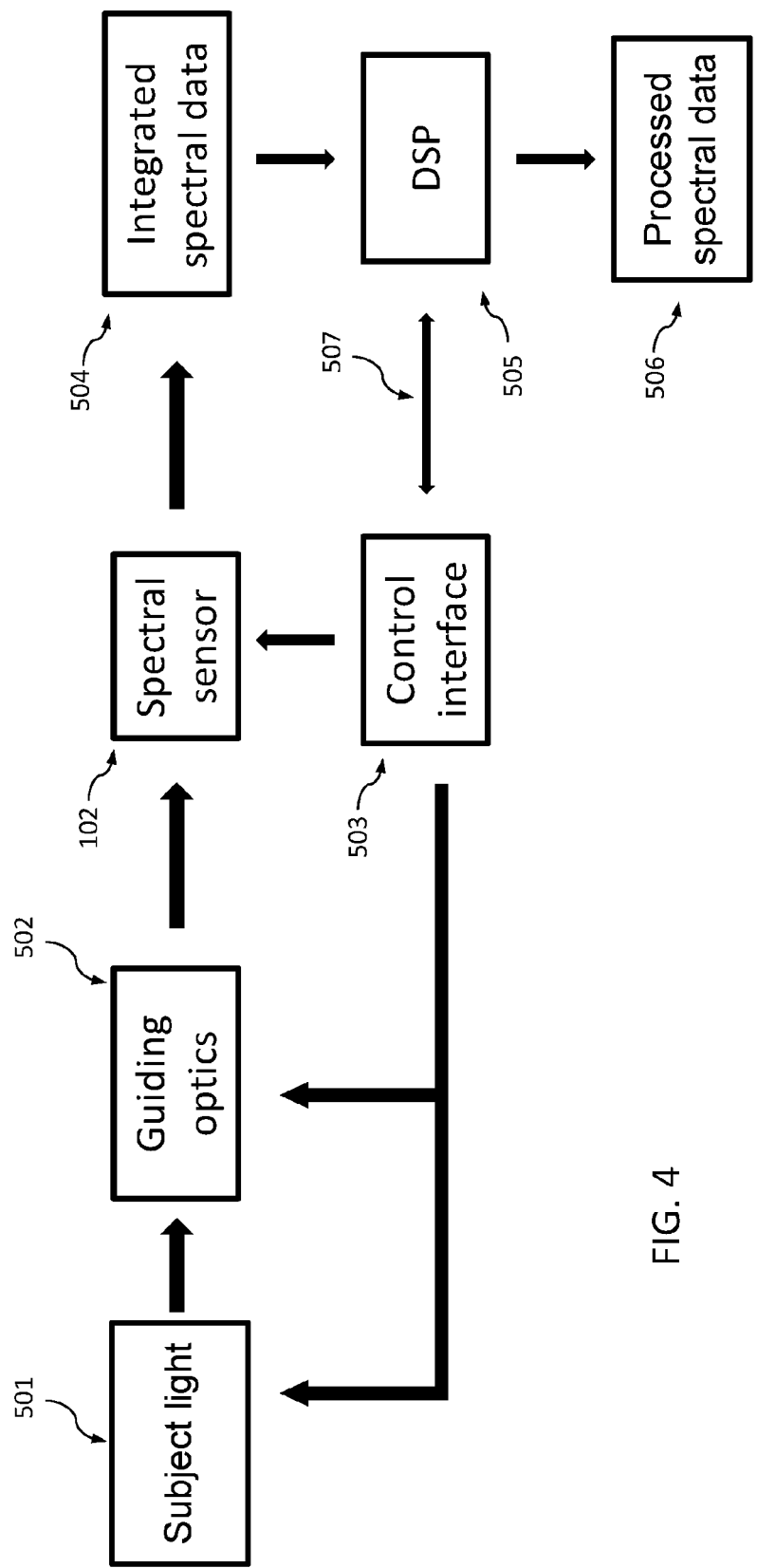
FIG. 4 schematically shows a representation of the operational arrangement of the spectral sensor of the present application.

The spectral sensor of the present application may be integrated as part of a sensing system, an example of which is presented in FIG. 4. As schematically shown, the subject light source (501) may be conditioned and/or focused over the spectral sensor (102) using guiding optics (502). A control interface (503) may drive the spectral sensor, adjusting the potentials $V_1$ and $V_2$. The control interface may have also control over the subject light source and guiding optics, for example for signal optimization. The spectral sensor (102) may output integrated spectral data (504), which may be fed to a digital signal processor (DSP, 505) to produce a spectral plot (506). The control interface (503) and DSP (505) may share a feedback mechanism (507) to optimize the output.

Figure 5A:
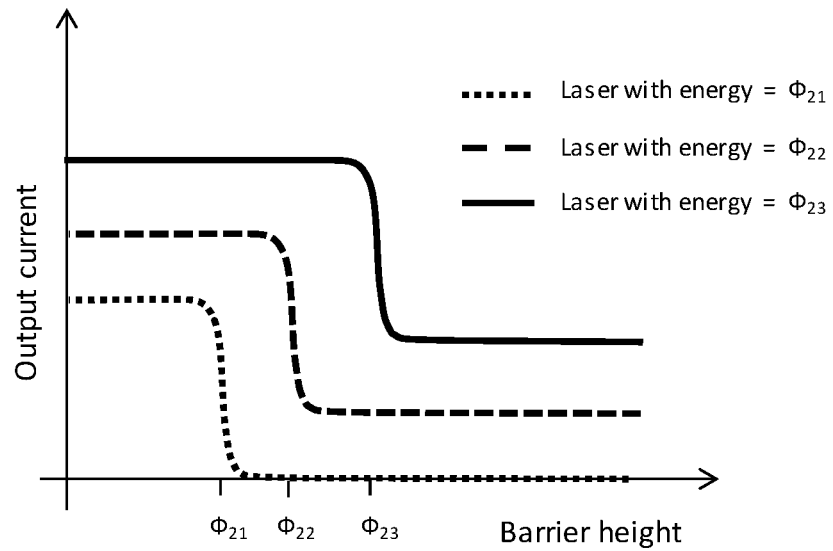
Figure 5B:
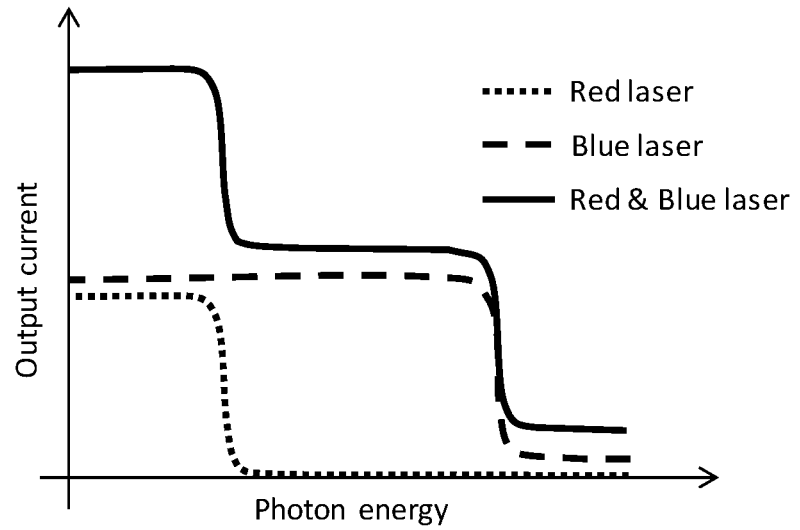

Exemplary idealized device output plots are given in FIGS. 5A-5C. In the plots shown therein, the different traces have been shifted vertically for clarity. FIG. 5A shows an exemplary output of the device when sequentially illuminated with monochromatic light of increasing energy $\phi_{21}$, $\phi_{22}$ and $\phi_{23}$. When the selection barrier height $\phi_2$ is low, the spectral sensor produces an output current proportional to the intensity of the incident light. As the height of the selection barrier is increased, the output current remains constant (provided that the intensity of the source also does so), until $\phi_2$ matches the laser energy $\phi_{2x}$ (x=1, 2, 3), at which point the output current falls to zero.

FIG. 5B illustrates an exemplary output of the device when illuminated with two different monochromatic sources of equal intensity, one emitting red light and the other emitting blue light, when the sources operate individually or concurrently. When the sources are operated individually, the corresponding output currents (dashed lines) are similar to those shown in FIG. 5A, the lower cut-off point corresponding to the red source (lower energy). When both sources are operated concurrently, the spectral output (continuous line) is the sum of both independent outputs.

FIG. 5C illustrates an exemplary output of the DSP stage corresponding to the spectral output of FIG. 5B. The individual monochromatic sources produce sharp peaks corresponding to their spectral distribution (dashed lines). When both sources operate concurrently, the DSP output reproduces the combined spectral distributions.

The spectral sensor described herewith may be physically implemented in numerous embodiments. In the present disclosure a number of embodiments are described by way of example, but it is to be understood that there may be many other ways in which the spectral sensor with the structure presented above may be built, and are implicitly incorporated in this disclosure.

FIG. 6 presents an exemplary architecture of the spectral sensor in which the respective regions have been arranged as a stack (600), with the subject light entering the device from one direction generally (but not necessarily) perpendicular to the stack. In FIG. 6, the light comes from above the device. The absorber (201) is at one end of the stack (the top in FIG. 6), followed by the injection barrier (202), the spillage well (203), the selection barrier (204) and, at the bottom, the collector (205). Also shown are the electrical contacts (601), (602) and (603) to the absorber (201), spillage well (203) and collector (205), respectively.

In some embodiments there may be one or more additional regions (layers) included as part of the spectral sensor. For example, although not specifically shown in FIG. 6, the spectral sensor may include one or more regions at the top (e.g., superimposed on the absorber in the thickness direction) for purposes such as protection of the underlying device, passivation, filtering, etc. Examples include one or more additional optical coatings configured to excite plasmon resonances; one or more additional optical coatings configured to reduce reflection of light; and/or one or more additional optical filtering regions configured to limit the lower and/or upper limit of wavelengths of the light entering the device. In other examples, there may be one or more additional regions at the bottom of the device for purposes such as providing a structural integrity, passivation, bottom electric contact, etc.

In some embodiments, light may enter the stack (600) from directions other than perpendicular to the stack (e.g., from directions other than the direction shown in FIG. 6). In an example, light may enter the device laterally from one of the sides, in a direction generally parallel to the regions of the stack. Such an arrangement may allow for increased absorption of the subject light, and hence increased generation of ballistic photo-generated carriers, as the subject light would be traversing a longer path inside the absorber.

As described above, the injection barrier may be provided at a lower height than the selection barrier. This may allow the device to cover a larger range of wavelengths with a smaller applied bias, with the injection barrier providing the long wavelength cut off and the short wavelength cut off being the point at which the bias between collector and absorber causes too much additional noise current (e.g. from avalanche breakdown).

Figure 7:
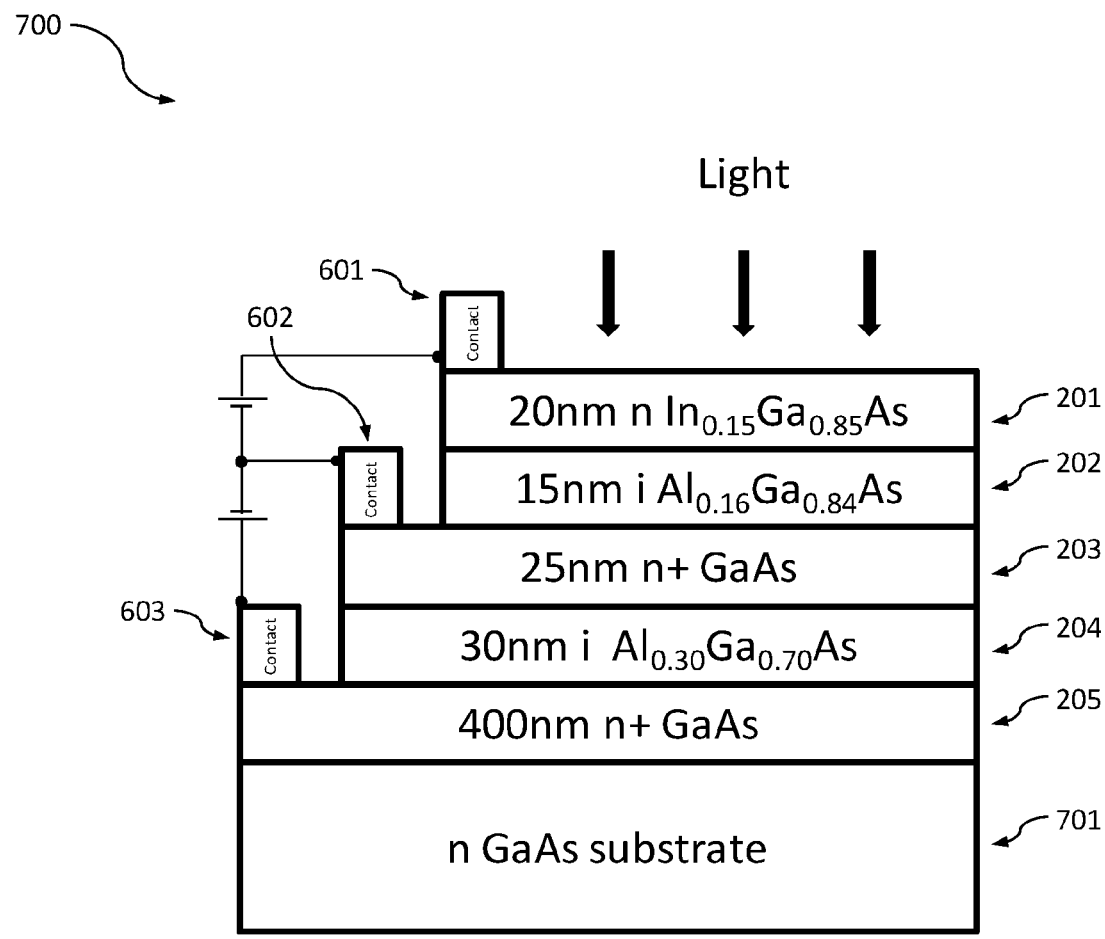
FIG. 7 is a schematic view of an exemplary implementation of the spectral sensor of the present application.

A particular embodiment of the spectral sensor with the architecture of FIG. 6, realized in a specific semiconductor materials system, is shown in FIG. 7 as stack (700). In the embodiment shown therein, the absorber (201) is a 20 nm-thick region of n-type $In_{0.15}Ga_{0.85}As$. The injection barrier (202) is a 15 nm-thick region of intrinsic $Al_{0.16}Ga_{0.84}As$. The spillage well (203) is a 25 nm-thick region of $n^+$-type GaAs. The selection barrier (204) is a 30 nm-thick region of intrinsic $Al_{0.30}Ga_{0.70}As$. The collector (205) is a 400 nm-thick region of $n^+$-type GaAs. There is also an n-type GaAs substrate (701) that may provide structural integrity. Suitable electric contacts (601, 602, 603) are made to the absorber (201), spillage well (203) and collector (205), respectively. A suitable electrical contact material for such a system would be PdGeAu, to provide an n-type, ohmic, shallow contact to nGaAs. The composition fractions (x) and thicknesses of the different regions described in embodiment 700 are only indicative, and may be increased or decreased as necessary to alter the characteristics of the device and/or its performance.

In the embodiment described in FIG. 7, the GaAs materials have an approximate mean free path of between 30-150 nm depending on the temperature of the structure and the doping of the regions. As such, $w_T=w_1+w_2$ should be of this thickness scale to allow ballistic transport from absorber to collector. In this example, $w_T=40$ nm, which is the same order of magnitude as the expected mean free path, fulfilling this criterion. These thicknesses can be varied in order to fine-tune device performance, while keeping the total length at the same scale as the mean free path.

For example, depending on anticipated light intensity and the impact of tunneling through the injection barrier, the injection barrier could be increased in thickness up to 30 nm (or whatever the mean free paths of the materials allow). The injection barrier thickness should be sufficient such that the impact of a tunneling current through this barrier from the absorber into the spillage well is negligible in comparison with the ballistic current traversing the top of the barrier. Here we define negligible as contributing to less than 5% of the total electron current from the absorber to the spillage well. The selection barrier thickness should be similarly tuned to reduce the impact from tunneling, but without such a constraint on the thickness, as ballistic transport through this region is not required as long as the bias between the spillage well and collector is such that the selection barrier has a flat band or a slight negative gradient to sweep electrons into the collector (i.e. $\phi_{int}=0$).

Additionally the spillage well thickness and doping can be tuned, with lower doping allowing for a longer mean free path and larger well, but this may result in worse ohmic contact. Exemplary doping levels for this region are $10^{17}$-$10^{18}$ $cm^{-3}$, and exemplary thicknesses are 10-30 nm.

Figure 8:
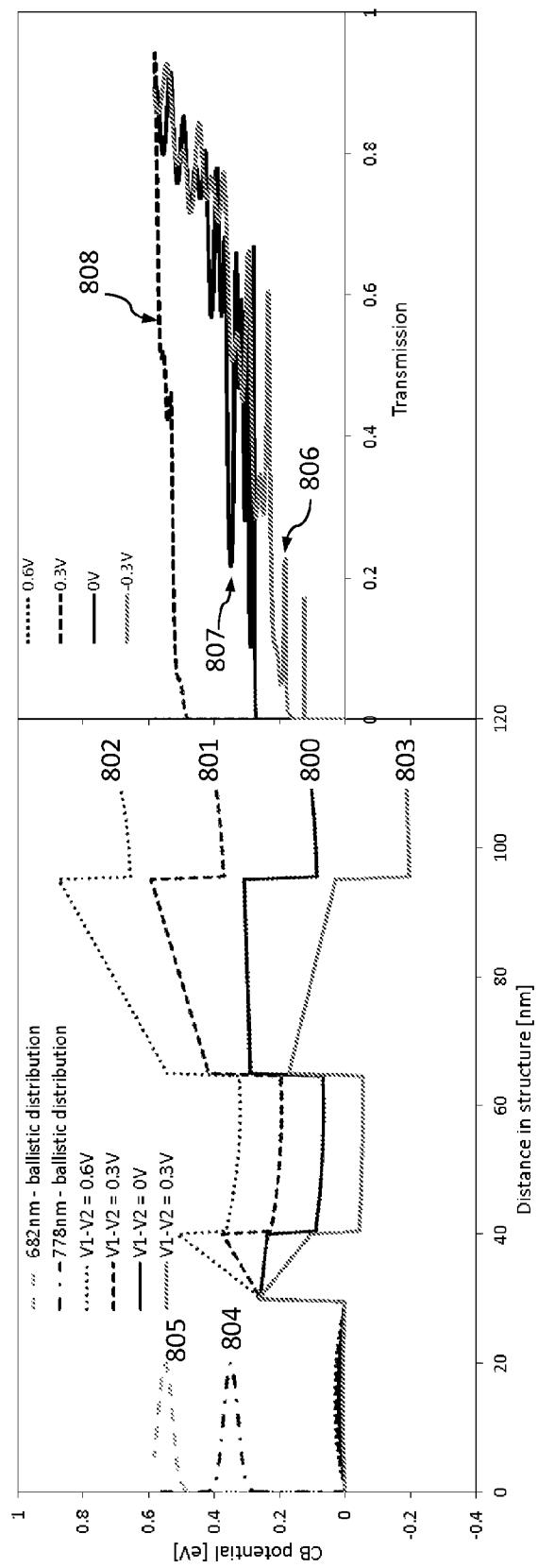
FIG. 8 is a graph showing exemplary band offsets at different applied biases of the conduction band structure of the stacked architecture of FIG. 7., as well as the transmission probability as a function of electron energy for each applied bias.

The band structure for the exemplary device of FIG. 7 is provided in FIG. 8, showing the conduction band profile for four different biasing conditions; illustrating the effect of an applied bias between the absorber and collector regions of −0.3V (803), 0V (800), 0.3V (801) and 0.6V (802). These biases are defined with respect to FIG. 3 as $V_1$–$V_2$, with both $V_1$ and $V_2$ of equal magnitude to deliver the stated total bias between collector and absorber. This specific example shows the same behavior as documented for the generic case (FIG. 3.) but for wavelength and material specific realizations, showing that for ballistic electrons generated by light of 778 nm (804) and 682 nm (805) in the InGaAs absorber region the application of a bias between the absorber and collector regions will cut off transmission of the ballistic electrons generated by the 778 nm light at a smaller bias than the electrons generated by 682 nm light. This is demonstrated on the right hand graph of FIG. 8, showing the transmission of an electron as a function of its energy from the absorber to the collector under these different bias conditions: −0.3V (806), 0V (807) and 0.3V (808). The transmission under 0.6V bias is negligible for the energies presented in this graph.

Figure 9:
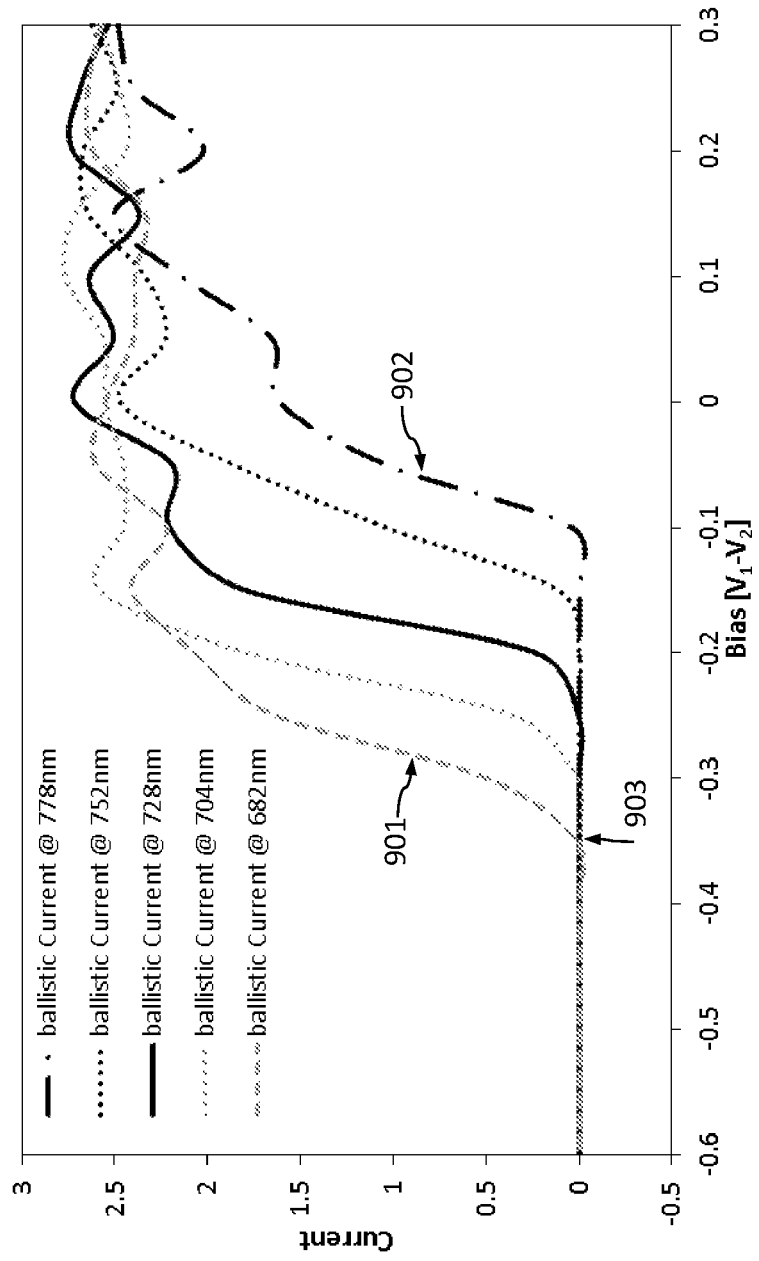
FIG. 9 is a graph showing the current voltage characteristic of an exemplary spectral sensor of the present application when illuminated with monochromatic light from 682 nm to 778 nm, showing the different characteristics for different wavelengths.

FIG. 9 shows the corresponding current voltage characteristics for the exemplary device of FIG. 7 under illumination with wavelengths of light from 682 nm (901) to 778 nm (902). FIG. 9 shows how the device can differentiate between different wavelengths of light with a current voltage sweep. The difference in peak current can be used to determine the total intensity of light and the voltage at which the current starts to increase (at point (903) for 682 nm light) can be used to determine the wavelength of incident light. Extracting this information may provide spectral information about the subject light source.

Figure 10:
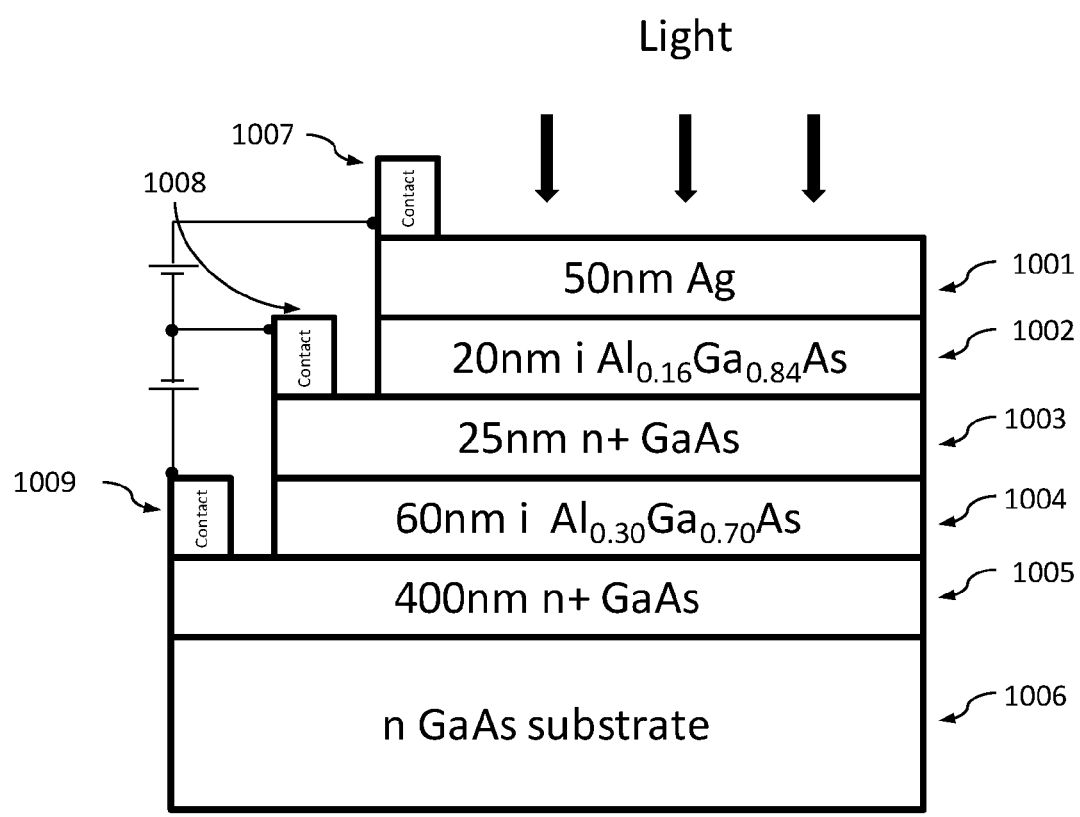
FIG. 10 is a schematic view of an exemplary spectral sensor of the present application having a stacked architecture with a metallic absorber.

In some embodiments, as described above, the absorber may be made of a metal. FIG. 10 shows an example in which the absorber is made of 50 nm Silver (region 1001). In this case the light is absorbed by the conduction electrons of the metal (free-electron absorption), with the electrons photo-excited to high energies and travelling ballistically in the Silver region. In this embodiment, Silver is chosen as it has a large mean free path (~100 nm) for ballistic transport. However, other metals can be chosen for this region as long as the total metal region thickness is less than the mean free path in that material. In some embodiments, the metal absorber region is thick enough to absorb or reflect the majority of the incident light. Thinner regions with higher transparencies could result in noise current from direct absorption in the semiconductor regions. However, this is not an essential feature if the wavelength range of interest for the source light is below the semiconductor band gap of the succeeding regions.

With continued reference to FIG. 10, the injection barrier adjacent to the metallic absorber is provided as an undoped or lightly doped (for example <$10^{17}$ cm$^{-3}$) Al$_{0.16}$Ga$_{0.84}$As semiconductor region 1002. The low doping may minimize the band bending in the semiconductor and may minimize tunneling from the metallic absorber. The low doping may also provide a longer mean free path in this region for the electrons.

The succeeding regions of the GaAs spillage well (1003) and Al$_{0.30}$Ga$_{0.70}$As selection barrier (1004) have similar constraints and requirements as detailed in previous embodiments and in principle this device works similarly following extraction from the metal. A benefit of using a metallic absorber is that a wider range of wavelengths may be accessible to the device, without having to overcome a bandgap for light to be absorbed. For example, depending on the metallic absorber and semiconductor(s) chosen to provide the injection barrier, selection barrier and spillage well, this device could operate from the terahertz wavelength through to the ultra violet wavelength. Virtually any semiconductor and metal combination could be used to provide this band structure, but in this embodiment GaAs/AlGaAs was chosen for consistency with the previously presented device shown in FIG. 7, as described above.

In some embodiments, the device may operate (as in the case of any one of the above embodiments) with the spillage well electrically disconnected and therefore not able to be held at an independently adjustable potential. In such a device, thermalized electrons may not be removed from the device through an electrical connection, but instead they recombine with the holes available in the spillage well. Such a device could be run discontinuously to ensure that electrons do not accumulate to such a large degree in the spillage well that they affect the band structure. For example, most semiconductors would utilize a time constant of about 1 ns between "exposures" to allow this recombination. This mode of operation would have the benefit of a simpler device architecture, but with most of the benefits of the previous embodiments. However, in such embodiments the ballistic region ($w_T'$) would now include the selection barrier and thus be $w_T' = w_1 + w_2 + w_3$ resulting in a shorter selection barrier. Given that the total thickness for $w_T$ in a GaAs system is 30-150 nm the selection barrier would be of a thickness of 20-110 nm in such a system, but could be larger or smaller in other materials systems. This is because in the structures with an electrically connected spillage well the selection barrier can be maintained as a flat band or with a slight bias to sweep electrons from this region into the collector (i.e. $\phi_{int}=0$). However, without this possibility, electrons must traverse the selection barrier ballistically, in addition to the injection barrier and spillage well.

In other embodiments, a device may be provided consisting of an array of the sensing devices that have been described in this disclosure. Such an arrayed device may be able to perform imaging tasks with spectral information. The arrayed device may then be referred as a hyperspectral imaging device.

INDUSTRIAL APPLICABILITY

The invention finds application in spectral sensing for industrial and consumer electronics. The device may be used carry out spectral analyses, such as absorption, fluorescence or Raman spectroscopies. As such, the device may be used in laboratory, industrial and automotive analytical equipment. Due to its robust and compact design, it is ideally suited to portable or handheld applications. In consumer electronics, the device may be integrated in products such as printers, mobile phones and tablet computers, as well as medical and personal health products.

What is claimed is:

1. A ballistic carrier spectral sensor, comprising:
    a photon absorption region configured to generate photo-generated carriers from incident light;
    a first potential barrier region adjacent the photon absorption region in a thickness direction and having an adjustable height, the height of the first potential barrier region defining a minimum energy of the photo-generated carriers required to pass therethrough;
    a second potential barrier region having an adjustable height, the height of the second barrier adjustable independent of the height of the first potential barrier region and defining a minimum energy of the photo-generated carriers required to pass therethrough;
    a spillage well region disposed between the first potential barrier region and the second potential barrier region in the thickness direction, the spillage well region configured to collect photo-generated carriers having an energy lower than that required to pass through the second potential barrier region; and a collection region adjacent the second potential barrier region and configured to collect carriers that cross the second potential barrier region, wherein:

a total thickness of the first potential barrier region and the spillage well region is less than a mean free path of the photo-generated carriers; and the thickness of the first potential barrier region reduces tunneling transfer of photo-generated carriers with an energy below its height to less than 5% of the total electron transfer.

2. The ballistic carrier spectral sensor of claim 1, wherein the height of the first potential barrier region is less than the height of the second potential barrier region.

3. The ballistic carrier spectral sensor of claim 1, wherein the thickness of the first potential barrier is 15 nm to 30 nm.

4. The ballistic carrier spectral sensor of claim 1, wherein the thickness of the second potential barrier region reduces tunneling transfer of carriers with an energy below its height to less than 5% of the total electron transfer.

5. The ballistic carrier spectral sensor of claim 1, wherein the thickness of the second potential barrier is 20 nm to 110 nm.

6. The ballistic carrier spectral sensor of claim 1, wherein the first potential barrier region, the second potential barrier region, the spillage well region, and the collection region comprise respective semiconductor materials.

7. The ballistic carrier spectral sensor of claim 1, wherein the first potential barrier region, the second potential barrier region, the spillage well region, and the collection region form a semiconductor heterostructure.

8. The ballistic carrier spectral sensor of claim 1, wherein the photon absorption region comprises a metal.

9. The ballistic carrier spectral sensor of claim 8, wherein the photon absorption region comprises Silver.

10. The ballistic carrier spectral sensor of claim 1, wherein the photon absorption region comprises a semiconductor material.

11. The ballistic carrier spectral sensor of claim 1, wherein the photon absorption region has a lower band gap energy than the band gap energy of the spillage well region.

12. The ballistic carrier spectral sensor of claim 1, wherein a thickness of the photon absorption region is less than a mean free path of the photo-generated carriers.

13. The ballistic carrier spectral sensor of claim 12, wherein the photon absorption region is less than 100 nm thick.

14. The ballistic carrier spectral sensor of claim 1, further comprising one or more additional optical coatings superimposed on the photon absorption region in the thickness direction, the one or more additional optical coatings configured to reduce reflection of light.

15. The ballistic carrier spectral sensor of claim 1, further comprising one or more additional optical coatings superimposed on the photon absorption region in the thickness direction, the one or more additional optical coatings configured to excite plasmon resonances.

16. The ballistic carrier spectral sensor of claim 1, further comprising one or more passivation regions included at one or both sides of the sensor in the thickness direction.

17. The ballistic carrier spectral sensor of claim 1, further comprising one or more additional optical filtering regions superimposed on the photon absorption region in the thickness direction to limit the lower and/or upper limit of wavelengths of the light entering the device.

18. An imaging device comprising an array of the ballistic carrier spectral sensors according to claim 1.

19. A ballistic carrier spectral sensor, comprising:

a photon absorption region configured to generate photo-generated carriers from incident light;

a first potential barrier region adjacent the photon absorption region in a thickness direction and having an adjustable height, the height of the first potential barrier region defining a minimum energy of the photo-generated carriers required to pass therethrough;

a second potential barrier region having an adjustable height, the height of the second barrier adjustable independent of the height of the first potential barrier region and defining a minimum energy of the photo-generated carriers required to pass therethrough;

a spillage well region disposed between the first potential barrier region and the second potential barrier region in the thickness direction, the spillage well region configured to collect photo-generated carriers having an energy lower than that required to pass through the second potential barrier region; and a collection region adjacent the second potential barrier region and configured to collect carriers that cross the second potential barrier region, wherein:

a total thickness of the first potential barrier region and the spillage well region is less than a mean free path of the photo-generated carriers;

the photon absorption region comprises n-type $In_xGa_{1-x}As$, where the x indicates the fraction of the composition ($0 \leq x \leq 1$); and the regions other than the photon absorption region are respectively comprised of $Al_xGa_{1-x}As$, wherein:

the first potential barrier region and the second potential barrier region comprise intrinsic type semiconductor materials; and the spillage well region and the collector region comprise n+ type semiconductor materials.

20. A ballistic carrier spectral sensor, comprising:

a photon absorption region configured to generate photo-generated carriers from incident light;

a first potential barrier region adjacent the photon absorption region in a thickness direction and having an adjustable height, the height of the first potential barrier region defining a minimum energy of the photo-generated carriers required to pass therethrough;

a second potential barrier region having an adjustable height, the height of the second barrier adjustable independent of the height of the first potential barrier region and defining a minimum energy of the photo-generated carriers required to pass therethrough;

a spillage well region disposed between the first potential barrier region and the second potential barrier region in the thickness direction, the spillage well region configured to collect photo-generated carriers having an energy lower than that required to pass through the second potential barrier region; and a collection region adjacent the second potential barrier region and configured to collect carriers that cross the second potential barrier region, wherein:

a total thickness of the first potential barrier region and the spillage well region is less than a mean free path of the photo-generated carriers; and the height of the first potential barrier region is less than the height of the second potential barrier region.

* * * * *